United States Patent [19]

Fithian et al.

[11] Patent Number: 4,967,258

[45] Date of Patent: Oct. 30, 1990

[54] STRUCTURE FOR USE IN SELF-BIASING AND SOURCE BYPASSING A PACKAGED, FIELD-EFFECT TRANSISTOR AND METHOD FOR MAKING SAME

[75] Inventors: Michael J. Fithian, Boulder; James E. Foster, Longmont, both of Colo.

[73] Assignee: Ball Corporation, Muncie, Ind.

[21] Appl. No.: 319,367

[22] Filed: Mar. 2, 1989

[51] Int. Cl.⁵ .................... H01L 27/02; H01L 23/78; H01L 23/02; H01L 39/02

[52] U.S. Cl. ........................................ 357/51; 357/68; 357/74; 357/80

[58] Field of Search .......................... 357/51, 68, 74, 80

[56] References Cited

U.S. PATENT DOCUMENTS

| | | | |
|---|---|---|---|
| 4,135,168 | 1/1979 | Wade | 331/108 R |
| 4,183,041 | 1/1980 | Goel | 357/81 |
| 4,298,846 | 11/1981 | Hirano et al. | 333/32 |
| 4,598,307 | 7/1986 | Wakabayashi et al. | 357/75 |
| 4,611,882 | 9/1986 | Ushida | 357/80 |
| 4,612,566 | 9/1986 | Kowata et al. | 357/80 |
| 4,617,586 | 10/1986 | Cuvilliers et al. | 357/80 |

FOREIGN PATENT DOCUMENTS

| | | | |
|---|---|---|---|
| 54-19360 | 2/1978 | Japan | 357/51 |
| 2123209 | 1/1984 | United Kingdom | 357/51 |

OTHER PUBLICATIONS

"Self-Bias Technique Improves Amplifier Gain and Noise Figure", M. J. Fithian, *Microwaves & RF*, (May, 1988), pp. 213-218.

*Primary Examiner*—J. Carroll
*Attorney, Agent, or Firm*—Sheridan, Ross & McIntosh

[57] ABSTRACT

The present invention provides a structure for use in self-biasing and source bypassing a packaged, field-effect transistor (FET) having first and second leads. The structure is readily assembled and provides an excellent noise figure.

25 Claims, 3 Drawing Sheets

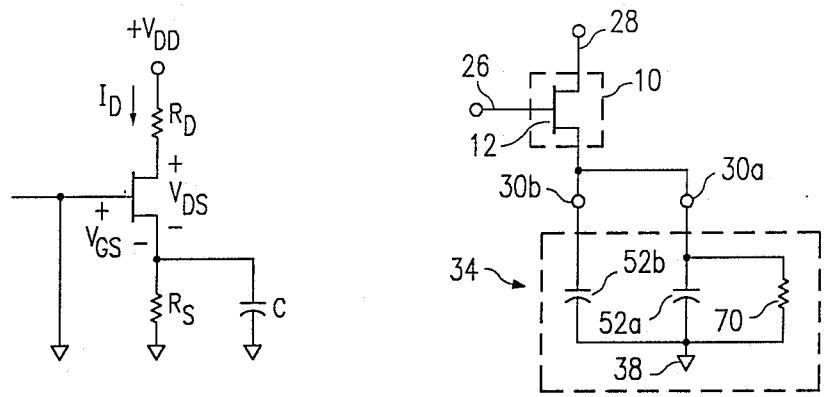
FIG. 1 (PRIOR ART)
FIG. 2
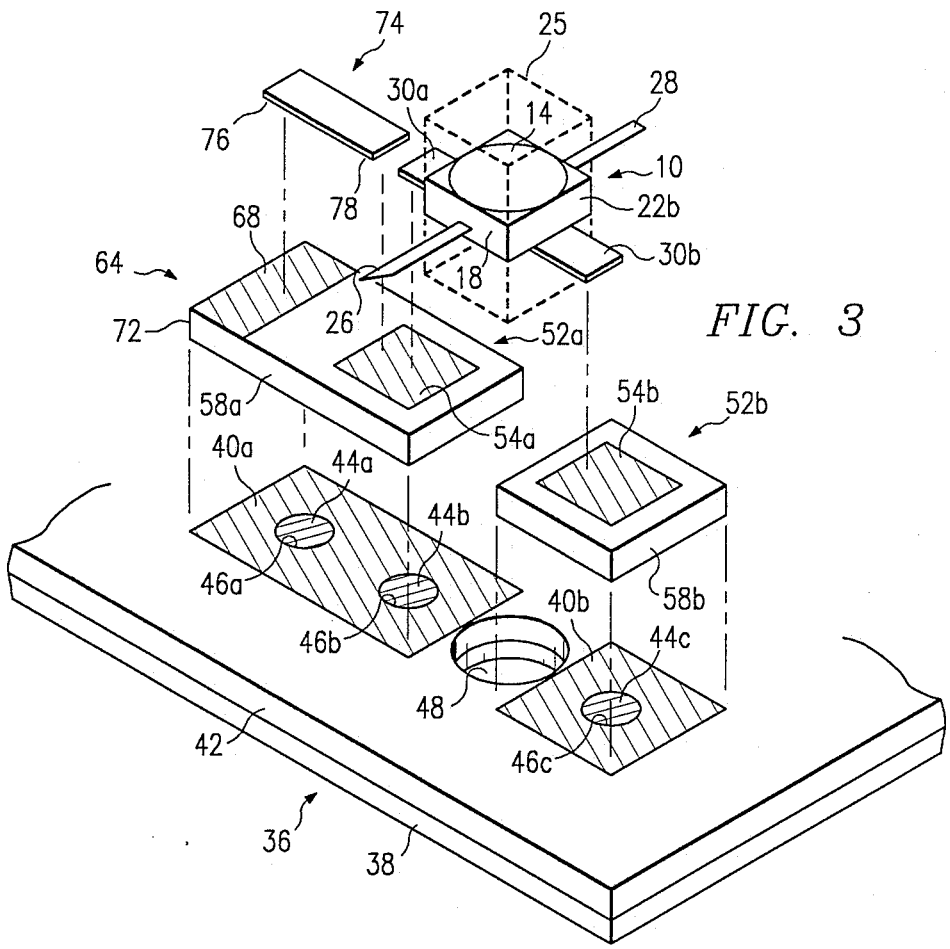
FIG. 3

STRUCTURE FOR USE IN SELF-BIASING AND SOURCE BYPASSING A PACKAGED, FIELD-EFFECT TRANSISTOR AND METHOD FOR MAKING SAME

FIELD OF THE INVENTION

The present invention relates to a structure for use in self-biasing and source bypassing a packaged, field-effect transistor and a method for making the structure. This invention was made with Goverment support under Contract No. JPL 957,567 awarded by the Jet Propulsion Laboratory.

BACKGROUND OF THE INVENTION

A field-effect transistor (FET) has three terminals: a gate, a drain and a source. The bias or operating point of the field-effect transistor is defined by the gate-to-source voltage ($V_{GS}$), the drain current ($I_D$), and the drain-to-source voltage ($V_{DS}$). Presently there are two techniques for establishing the bias or operating point of an FET. The first technique is known as the two-supply biasing technique. The two-supply biasing technique requires two steps. In the first step a negative voltage supply is used to establish a gate-to-source voltage which, in turn, establishes a drain current. In the second step a positive voltage supply is used to establish a drain-to-source voltage. More specifically, the drain-to-source voltage is defined to be the voltage supplied by the positive voltage supply less a voltage drop created by the drain current passing through a drain resistor.

The primary advantage associated with the two-supply biasing technique is that the components used to implement it have a minimal effect upon the noise figure of the FET during AC operation. Noise figure is defined as the ratio of the actual noise power output of a device to an ideal noise power output for the device where the only source of noise is attributable to the signal being processed by the device. In other words, the noise figure is a quantitative measure of the noisiness of the device or the degree to which the device itself contributes to the amount of noise found in its output signal. The noise figure of a device is an important consideration in applications where the device is to process an input signal that contains significant, low-amplitude information since a device with a relatively high noise figure would bury or obscure the significant, low-amplitude information in its output signal.

However, certain characteristics of the two-supply biasing technique may render it unsuitable for certain applications. Namely, the two-supply biasing technique requires two voltage supplies of opposite polarity. Further, three resistors are required to implement the two-supply biasing technique: a two-resistor, voltage divider to establish the gate-to-source voltage and a drain resistor. Moreover, it is critical that the first step of the two-supply biasing technique be executed before the second step to prevent destruction of the FET. Consequently, sequencing circuitry is required to implement the two-supply biasing technique. Further, the two-supply biasing technique is temperature sensitive. Hence, in applications where the FET is exposed to broad variations in temperature and it is critical that the FET be maintained at a specific operating point implementation of the two-supply biasing technique requires the addition of temperature compensation circuitry. In addition, failure of either or both of the voltage supplies used to implement the two-supply biasing technique can result in destruction of the FET. Consequently, implementation of two-supply biasing technique in applications where failure of the voltage supplies is a possibility and the consequence thereof is unacceptable it is necessary to include circuitry that is capable of detecting the failure of either voltage supply and taking the appropriate action to prevent destruction of the FET.

With reference to FIG. 1, the second biasing technique is known as the self-biasing technique. In the self-biasing technique the operating or bias point of the FET is defined in a single step by a source resistor, a drain resistor and a positive voltage supply connected in series with the drain resistor. A bypass capacitor is connected in parallel with the source resistor to reduce the adverse effects of the source resistor on the gain and the noise figure of the FET during AC operation thereof.

The self-biasing technique exhibits several characteristics which, in certain situations, render the self-biasing technique superior to the two-supply biasing technique. For instance the self-biasing technique requires only one voltage supply. Furthermore, only two resistors are required to implement the self-biasing technique (i.e., the drain resistor and the source resistor). Moreover, no sequencing circuitry is required to implement the self-biasing technique since it is sequence independent. Further, temperature compensation circuitry is not necessary to implement the self-biasing technique since it is relatively insensitive to temperature variations. In addition, failure of the voltage supply used to implement the self-baising technique will not destroy the FET. Consequently, there is no need for circuitry to detect a voltage supply failure in implementing the self-biasing technique.

Despite such advantages, present structures utilized to define and/or implement a source resistor and a bypass capacitor for self-biasing and source bypassing are inadequate, from a noise contribution standpoint, where critical low-amplitude information carried by an input signal is to be processed and/or where use of a low-noise FET is otherwise required. Further, such known structures are particularly unsuitable due to noise contribution where high-frequency input signals (i.e., 1–12 GHz) are to be processed by current, high-frequency, low-noise FETs. For instance, such high-frequency, low-noise FETs are typically very expensive due to, among other things, the technology incorporated therein to overcome the increase in noise figure associated with the higher operating frequency. In such a situation, the noise contributed by current, self-biasing and source bypassing structures negates the low-noise figure advantage of such FETs and, hence, the investment in such FETs. Exemplary of known self-biasing and/or source bypassing structures are those shown in U.S. Pat. No. 4,183,041 to Goel, and U.S. Pat. No. 4,617,586 to Cuvilliers et al. As indicated, these structures and/or components fail to provide self-biasing arrangements and/or source bypassing that would suitably reduce noise contribution for the above-noted applications.

Presently, there exists a need for an FET biasing and bypass structure that is reliable, relatively insensitive to temperature variations, relatively light-weight and small, and that has a reduced effect on the noise figure of the FET. Moreover, there is a need for an FET biasing and bypass structure that can accommodate present packages embodying high-frequency FETs, i.e.

FETs that operate in the microwave spectrum extending from 1-12 GHz, and especially high-frequency FETs with low noise figures. Such a need exists, for example, in high-frequency, space-based, surface imaging radar systems. In such systems, it is desirous to employ present high-frequency, low-noise FET packages that have laterally extending source leads.

In relation to such needs, the aforementioned two-supply biasing technique is capable of accommodating the low noise figure requirements. However, the self-biasing technique is clearly superior to the two-supply biasing technique with respect to the remaining criteria. More specifically, the need for two power supplies, sequencing circuitry, temperature compensation circuitry, circuitry for protecting the FET from voltage supply failures and the like renders the two-supply biasing technique unsuitable in comparison to the self-biasing technique. Moreover, the two-supply biasing technique is necessarily more complex and, hence, less reliable than the self-biasing technique. Given the drawbacks associated with the two-supply biasing technique, there exists a need for a self-biasing structure which exhibits a low noise impact and is otherwise acceptable with respect to the above-specified needs.

Further, there is a need for a self-biasing structure that can be readily assembled, preferably in a single step, and that is easy to inspect.

SUMMARY OF THE INVENTION

The present invention provides a structure for self-biasing and source bypassing a packaged, field-effect transistor that is characterized by the presence of a first source lead and a second source lead. Further, in the preferred embodiment, the present invention particularly accommodates a low-noise, high-frequency FET having laterally extending, coplanar source leads.

The present invention includes a grounding structure and a source resistor for use in biasing the FET at a desired operating point. The source resistor includes a first terminal that is electrically connected to the grounding structure and a second terminal that is electrically connected to either the first source lead or the second source lead of the FET. Also included in the invention is a first capacitor for bypassing the first source lead. The first bypass capacitor includes a lower plate that is separated from a upper plate by a dielectric. The present invention also includes a second capacitor for bypassing the second source lead. The second bypass capacitor, like the first capacitor, includes a lower plate, an upper plate and a dielectric. The lower plates of the first and second capacitors are electrically connected to the grounding structure. The first upper plate of the first capacitor and the second upper plate of the second capacitor are positioned such that direct electrical contact can be established with, respectively, the first source lead and the second source lead, so as to substantially reduce any structure located intermediate to the source leads and the upper plates of the capacitors which could degrade the noise figure of the FET.

In the preferred embodiment of the invention the upper plates of the capacitors are positioned such that they are substantially coplanar thereby reducing the length of those portions of the source leads that are located intermediate the side or sides of the FET package and the point of attachment to the upper plates of the capacitors for a given separation of the capacitors. By reducing the lengths of the aforementioned portions of the source leads for a given separation of the first and second capacitors the effect of the bypass capacitors on the noise figure of the FET is reduced. In contrast, if the upper plates of the capacitors were not coplanar then the source leads would have to be bent in order to be attached to the upper plates. Bending of the source leads for attachment to the upper plates results in the aforementioned portions of the source leads being longer than if the upper plates were coplanar.

In another aspect of the present invention, the upper and lower plates of the capacitors are located outside, but immediately adjacent to a cylinder defined by extending the sides of the FET package. Such positioning insures contact with the source leads outside of the cylinder to avoid capacitive coupling, and serves to reduce the required structure located intermediate to the side or sides of the FET package and the point of attachment to the upper plates of the capacitors. In one implementation of this embodiment the upper plates of the capacitors are separated by at least the width of the package at the point where the first and second source leads extend past the sides thereof.

In an alternate embodiment of the invention, suitable for use with FETs that have either coplanar or non-coplanar source leads, the first upper plate of the first capacitor is disposed for direct, overlapping contact by the first source lead of the FET. Similarly, the second upper plate of the second capacitor is disposed for direct, overlapping contact by the second source lead of the FET. Preferably, the first upper plate and first source lead are provided in a parallel relationship, and the second upper plate and second source lead are provided in a parallel relationship.

In the preferred embodiment of the invention the grounding structure preferably includes a printed circuit board having at least one substantially planar land located on one side thereof. A grounding plane is located on the other side of the printed circuit board. A substrate is located intermediate the land and the grounding plane. The grounding structure further includes at least one grounding pin for providing an electrical connection between the land and the grounding plane. The preferred embodiment further includes first and second capacitors having upper and lower plates that are separated by dielectrics. The distance between the upper and lower plates of the first and second capacitors is substantially equivalent. Consequently, upon attachment of the lower plates of the capacitors to the substantially planar land the upper plates are substantially coplanar. Further, a wrap-around connector for connecting the source resistor to ground is preferably integrated onto the same dielectric as one of the capacitors. The wrap-around connector includes a first portion that electrically contacts the land, a second portion that is substantially coplanar with the upper plates of the capacitors, and a third portion located on the side of the dielectric and connecting the first and second portions. Consequently, the second portion of the the wrap-around connector, and the upper plates of the first and second capacitors are all substantially coplanar thereby facilitating attachment of the first and second source leads of the FET to the upper plates of the capacitors, and a chip resistor between the second portion of the wrap-around connector and the upper plate of one of the capacitors. T h e planar character of all of the constituent components of the preferred embodiment of the invention discussed immediately hereinabove facilitate its assembly. Moreover, the electrical and mechanical connection of the constituent components of the preferred embodiment of the invention together with the connection of the source leads thereto is accomplished in a single step by using an unflowed solder at the points of contact therebetween. The resulting structure is then heated thereby causing the solder to flow and the substantially simultaneous union of the aforementioned parts.

BRIEF DESCRIPTION OF THE DRAWINGS

FIG. 1 is a schematic of a self-biased and source bypassed, field-effect transistor;

FIG. 2 is a schematic of the preferred embodiment of the invention;

FIG. 3 is an exploded perspective view of the preferred embodiment of the invention;

DETAILED DESCRIPTION OF THE PREFERRED EMBODIMENT

Figure 4:
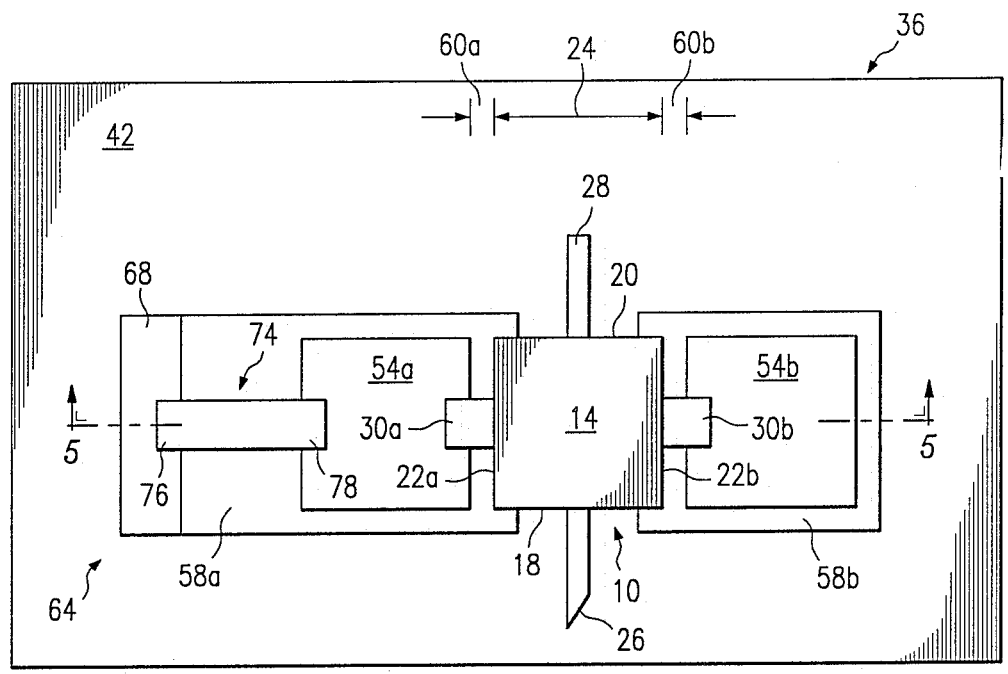
FIG. 4 is a top view of the preferred embodiment of the invention.
Figure 5:
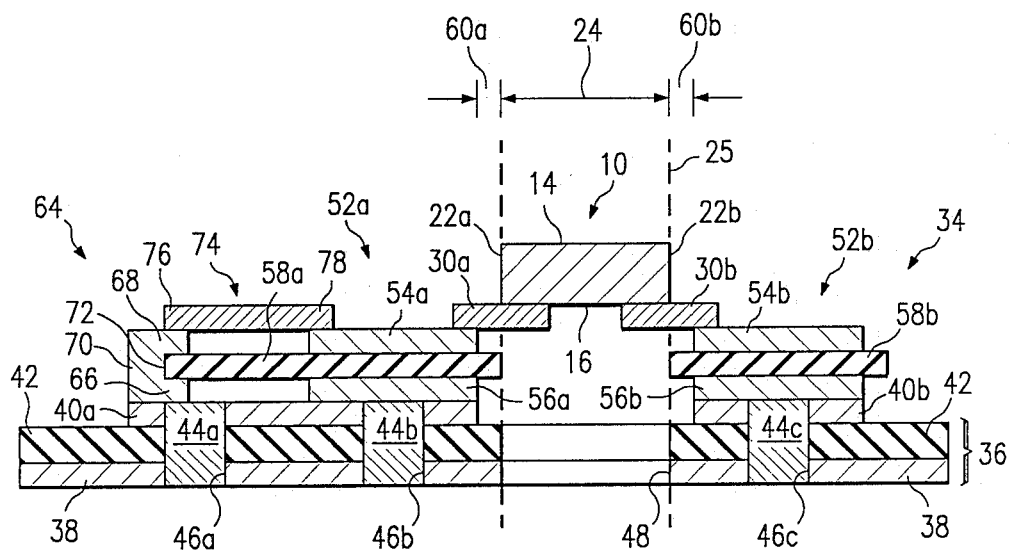
FIG. 5 is a cross-sectional view of the preferred embodiment of the invention.

With reference to FIGS. 2-5, a package 10 for housing a field-effect transistor 12, hereinafter FET 12, is illustrated. The package 10 includes a top side 14, a bottom side 16 and a periphery defined by, a gate side 18, a drain side 20, and a first source side 22a separated from a second source side 22b by a distance 24. The periphery of the package 10 further defines the boundaries of an imaginary cylinder 25 surrounding the package 10. A gate lead 26 and a drain lead 28 protrude from the bottom side 16 of the package 10. The gate lead 26 and the drain lead 28 extend parallel to the bottom side 16 and perpendicular to, respectively, the gate side 18 and the drain side 20 of the package 10. A first source lead 30a and a second source lead 30b also protrude from the bottom side 16 of the package 10. The first and second source leads 30a, 30b, extend parallel to the bottom side 16 and perpendicular to, respectively, the first source side 22a and the second source side 22b. The gate lead 26, drain lead 28, first source lead 30a and second source lead 30b constitute the interface to the FET 12. The FET 12 is, preferably, a high-frequency (i.e. 1-12 GHz) low-noise FET that is made of gallium-arsenide (GaAs).

With continuing reference to FIGS. 2-5, a preferred structure 34 for use in self-biasing and source bypassing the FET 12 is illustrated. The structure 34 includes a soft substrate printed circuit board 36 having a grounding plane 38 located on the bottom side thereof. A first substantially planar land 40a and a second substantially land 40b are located on the top side of the printed circuit board 36 and separated from one another by at least the distance 24 to reduce capacitive coupling with the FET 12. Moreover, the first and second lands 40a, 40b, are substantially coplanar with respect to one another. A substrate 42 is located intermediate to the grounding plane 38 and the first and second lands 40a, 40b. Grounding pins 44a, 44b and 44c are located in holes 46a, 46b and 46c and provide an electrical path between the grounding plane 38 and the first and second lands 40a, 40b. A hole 48 is located intermediate the first and second lands 40a, 40b to assure that there is no capacitive coupling between the FET 12 and the grounding plane 38. Preferably, the grounding plane 38, first land 40a and the second land 40b are made of copper and grounding pins 44a, 44b, 44c, are made of brass.

The structure 34 further includes a first bypass capacitor 52a and a second bypass capacitor 52b for use in grounding, respectively, the first and second source leads 30a, 30b, of the FET 12 during AC operation. The first bypass capacitor includes a first upper plate 54a separated from a first lower plate 56a by a first dielectric 58a. Similarly, the second bypass capacitor includes a second upper plate 54b separated from a second lower plate 56b by a second dielectric 58b. Preferably, the first upper plate 54a is substantially the same thickness and made from the same material as the second upper plate 54b; the first lower plate 56a is substantially the same thickness and made from the same material as the second lower plate 56b; and the first dielectric 58a is substantially the same thickness and made from the same material as the second dielectric 58b. Due to the aforementioned features the first and second capacitors 52a, 52b, are of substantially the same height and provide substantially the same capacitance. The first and second capacitors 52a, 52b, are located such that the first and second lower plates 56a, 56b, are in electrical contact with the first and second lands 40a, 40b. The first and second lands 40a, 40b, as previously discussed, are in electrical contact with the grounding plane 38 via the grounding pins 44a, 44b, 44c. Consequently, the first and second lands 40a, 40b, together with the grounding pins 44a, 44b, 44c, provide an electrical connection between the first and second capacitors 52a, 52b, and the grounding plane 38. The first and second capacitors 52a, 52b, are also separated by at least the distance 24 to reduce any capacitive coupling between the FET 12 and the plates of the first and second capacitors 52a, 52b. For the purpose of illustrating the advantages of the structure 34 the first and second capacitors 52a, 52b are separated by slightly more than the distance 24 thereby resulting in a first length 60a of the first source lead 30a existing between the first source side 22a of the package 10 and the point of attachment to the first upper plate 54a of the first capacitor 52a. Similarly, a second length 60b of the second source lead 30b exists between the second source side 22b of the package 10 and the point of attachment to the second upper plate 54b of the second capacitor 52b. Preferably, the first and second upper plates 54a, 54b, and the first and second lower plates 56a, 56b, are made of gold. Moreover, the first dielectric and the second dielectric are, preferably, made of a type CG titanate material that has a dielectric constant of seventy-five.

The elements of the structure 34 discussed thus far have several advantages with respect to the operation of the FET 12 mounted thereon. Namely, the first upper plate 54a of the first capacitor 52a and the second upper plate 54b of the second capacitor 52b are positioned such that the first and second source leads 30a, 30b, can be directly connected thereto thereby reducing any degradation in the noise figure that can be attributed to a structure or structures interposed between the source leads and the point at which they contact the capacitors. Furthermore, since the first and second capacitors 52a, 52b, are substantially the same height the first and second upper plates 54a, 54b, are substantially coplanar once the first and second capacitors 52a, 52b, are mounted on the substantially planar first and second lands 40a, 40b. As a consequence thereof the first and second lengths 60a, 60b, of the first and second source leads 30a, 30b, are minimized for a given separation of the first and second capacitors 52a, 52b, thereby reducing any degradation in the noise figure attributable thereto. Moreover, by positioning the first and second capacitors 52a, 52b, such that they are separated by the distance 24 the first and second lengths 60a, 60b, can be substantially reduced to zero thereby further reducing the noise figure. Additionally, by separating the first and second capacitors 52a, 52b, by at least the distance 24 any capacitive coupling between the FET 12 and the plates of the capacitors which could degrade the noise figure is reduced. Further, by positioning the first and second lands 40a, 40b, such that they are separated by at least the distance 24 any capacitive coupling between the FET 12 and the first and second lands 40a, 40b, which could degrade the noise figure is also reduced. Moreover, any capacitive coupling between the FET 12 and the grounding plane 38 which could degrade the noise figure is reduced by the hole 48. Of additional significance, first and second capacitors 52a, 52b, are disposed relative to source leads 30a, 30b, such that contact therebetween is outside of the cylinder defined by the sides of FET package 10, thereby preventing capacitive coupling between the first and second capacitors 52a, 52b, and the FET 12.

The preferred embodiment of the structure 34 further includes a wrap-around connector 64 for connecting one terminal of a source bias resistor to ground. The wrap-around connector 64 is preferably integrated onto the same substrate that acts as a dielectric for the first bypass capacitor 52a. The wrap-around connector 64 includes a first portion 66 for electrically contacting the first land 40a, a second portion 68 for electrically contacting one terminal of a source bias resistor, and a third portion 70 extending along an edge 72 of the first dielectric 58a and connecting the first portion 66 and the second portion 68. The first portion 66 of the wrap-around connector 64 is substantially the same thickness as the first, lower plate 56a of the first capacitor 52a. Similarly, the second portion 68 of the wrap-around connector 64 and the first upper plate 54a of the first capacitor 52a are of substantially of the same thickness. The wrap-around connector 64 is positioned such that the first portion 66 makes electrical contact with the first land 40a. Thus, an electrical path for connecting a source bias resistor to the ground plane 38 is defined by the wrap-around connector 64, the first land 40a and the grounding pins 44a, 44b. Further, since the second portion 68 of the wrap-around connector 64 is the same thickness as the first upper plate 54a and is formed on the same dielectric as the first capacitor 52a, i.e., the first dielectric 58a, the second portion 68 is substantially coplanar with both the first and second upper plates 54a, 54b, of the first and second capacitors 52a, 52b.

The preferred embodiment of the structure further includes a chip resistor 74 for use in self-biasing the FET 12. The chip resistor 74 includes a first terminal 76 and a second terminal 78. The first terminal 76 of the chip resistor 74 is located such that it electrically contacts the second portion 68 of the wrap-around connector 64 thereby connecting the first terminal 76 to the ground plane 38 via the electrical path defined by the wrap-around connector 64, the first land 40a, and the grounding pins 44a, 44b. The second terminal 78 of the chip resistor 74 is located such that it electrically contacts the first upper plate 54a of the first capacitor 52a. Since the first upper plate 54a is connected to the first source lead 30a of the FET 12 connection of the second terminal 78 to the first, 10 upper plate 54a effectively results in connection of the second terminal 78 of the chip resistor 74 to the source lead 30a.

Operation of the structure 34 in conjunction with a drain resistor and a positive voltage supply as illustrated in FIG. 1 results in the FET being self-biased and source bypassed. More importantly the structure 34 does not substantially contribute to the noise figure of the FET 12. As a consequence thereof applications that require a FET with a low noise figure, and especially those utilizing a high-frequency low-noise FET, can now use the self-biasing technique.

As should be appreciated, another embodiment of the present invention could readily accommodate FET packages having non-coplanar source leads extending from the sides thereof. In such an embodiment, the first upper plate 54a of first bypass capacitor 52a could be provided immediately adjacent to the side of the FET package for direct overlapping contact by a substantially parallel first source lead of the FET package. Similarly, the second upper plate 54b of second bypass capacitor 52b could be provided immediately adjacent to the side of the FET package for direct overlapping contact by a substantially parallel second source lead of the FET package. That is, even though the first upper plate 54a and second upper plate 54b would not be coplanar, the invention would still serve to reduce noise by reducing the intermediate structures between the source leads and capacitors.

The electrical and mechanical connection of the components of the structure 34 together with the connection of the first and second source leads 30a, 30b, thereto is readily accomplished by defining areas of contact between: the first lower plate 56a of the first capacitor 52a and the first land 40a; the second lower plate 56b of the second capacitor 52b and the second land 40b; the first portion 66 of the wrap-around connector 64 and the first land 40a; the first lead 76 of the chip resistor 74 and the second portion 68 of the wrap-around connector 64; the second lead 78 of the chip resistor 74 and the first upper plate 54a of the first capacitor 52a; the first source lead 30a and the first upper plate 54a and the second source lead 30b and the second upper plate 54b. An unflowed solder, preferably an indium-type solder, is then located at each of the defined areas by coating either or both of the interfacing parts with the unflowed solder. The constituent parts of the structure 34 and the first and second source leads 30a, 30b, of the FET 12 are then assembled such that the defined areas are in contact with one another. The structure 34 and the FET 12 are then heated thereby causing the solder to flow and, hence, mechanically and electrically joining the constituent parts of the structure 34 and the first and second source leads 30a, 30b, of the FET 12 thereto at the defined areas in a single step. In addition, the gate lead 26 and the drain lead 28, which are substantially coplanar with the first and second source leads 30a, 30b, are preferably connected to the appropriate componentry during the aforementioned process.

As will be apparent to those skilled in the art a number of variations of the described embodiment of the invention are possible. For example, the need for the lands 40a, 40b, and grounding pins 44a, 44b, 44c, could be eliminated if the first and second lower plates 56a, 56b, of the first and second capacitors 52a, 52b, could be directly connected to a grounding plane. Further, the first and second lower plates 56a, 56b, and the first portion 66 of the wrap-around connector 64 could be directly attached to the grounding pins 44a, 44b, 44c, thereby eliminating the first and second lands 40a, 40b.

Alternatively, lands could be provided that function as the lower plates of the capacitors thereby eliminating the need for the first and second lower plates 56a, 56b, of the capacitors 52a, 52b. Further, the wrap-around connector 64 could be separated from the first capacitor 52a. Moreover, the wrap-around connector could be replaced with a simple block-like structure having the appropriate height. Further, the upper and lower plates of the first and second capacitors 52a, 52b, together with the wrap-around connector 65 or equivalent structure could be placed on the same dielectric substrate, different dielectric substrates or any combination thereof. Similarly, if the structure does not include a wrap-around connector or similar structure, and the source bias resistor is connected in some other fashion, then the upper and lower plates of the first and second capacitors 52a, 52b, could be placed on the same or different, dielectric substrates. Placement of the upper and lower plates of the first and second capacitors 52a, 52b, on a single dielectric substrate according to either of the aforementioned variations may adversely affect the noise figure of the FET.

The foregoing description of the invention has been presented for purposes of illustration and description. Further, the description is not intended to limit the invention to the form disclosed therein. Consequently, variations and modifications commensurate with the above teachings, and the skill or knowledge in the relevant art are within the scope of the present invention. The preferred embodiment described hereinabove is further intended to explain the best mode known of practicing the invention and to enable others skilled in the art to utilize the invention in various embodiments and with the various modifications required by their particular applications or uses of the invention. It is intended that the appended claims be construed to include alternative embodiments to the extent permitted by the prior art.

What is claimed is:

1. A self-biased and source bypassed, packaged, field-effect transistor structure, comprising:
    a packaged, field-effect transistor including a housing having a defined width, a field-effect transistor located within said housing, and first and second source leads extending from said field-effect transistor, through said housing, and outward from said housing;
    means for grounding, wherein at least a portion of said housing is located intermediate said packaged, field-effect transistor and said means for grounding;
    a source resistor for use in biasing the field-effect transistor, said source resistor having a first terminal electrically contacting said means for grounding and a second terminal electrically contacting at least one of the source leads;
    a first capacitor for use in grounding the first source lead of the field-effect transistor during AC operation, said first capacitor having a first lower plate electrically contacting said means for grounding and a first upper plate separated from said first lower plate by a first dielectric, wherein said first upper plate of said first capacitor is positioned adjacent to the first source lead of the packaged, field-effect transistor for direct electrical connection therewith;
    a second capacitor for use in grounding the second source lead of the field-effect transistor during AC operation, said second capacitor have a second lower plate electrically contacting said means for grounding and a second upper plate separated from said second lower plate by a second dielectric, wherein said second upper plate of said second capacitor is positioned adjacent to the second source lead of the packaged, field-effect transistor for direct electrical connection therewith.

2. A structure, as claimed in claim 1, wherein:
    said first upper plate of said first capacitor and said second upper plate of said second capacitor are substantially coplanar.

3. A structure, as claimed in claim 1, wherein:
    said means for grounding includes a substantially planar surface for electrically contacting said first lower plate of said first capacitor and said second lower plate of said second capacitor.

4. A structure, as claimed in claim 3, wherein:
    said first lower plate of said first capacitor is separated from said first upper plate by a defined distance and said second lower plate of said second capacitor is separated from said second upper plate by said defined distance.

5. A structure, as claimed in claim 2, wherein:
    said means for grounding includes a connector for electrically connecting said means for grounding and said first terminal of said resistor, said connector having a first end for electrically contacting said means for grounding and a second end for electrically contacting said first terminal of said resistor, wherein said second end is substantially coplanar with said first upper plate of said first capacitor.

6. A structure, as claimed in claim 5, wherein:
    a portion of said connector is operatively attached to at least one of the following: said first dielectric and said second dielectric.

7. A structure, as claimed in claim 5, wherein:
    said first dielectric is the same as said second dielectric and a portion of said connector is operatively attached to said dielectric.

8. A structure, as claimed in claim 5, wherein:
    said first terminal of said resistor electrically contacts said second end of said connector and said second terminal of said resistor electrically contacts said first upper plate of said first capacitor.

9. A structure, as claimed in claim 8, wherein said resistor is a chip resistor.

10. A structure, as claimed in claim 3, wherein:
    said means for grounding includes a connector for electrically connecting said substantially planar surface and said first terminal of said resistor, said connector having a first end for electrically contacting said substantially planar surface and a second end for electrically contacting said first terminal of said resistor, wherein said second end is substantially coplanar with said first upper plate of said first capacitor.

11. A structure, as claimed in claim 10, wherein:
    a portion of said connector is operatively attached to at least one of the following: said first dielectric and said second dieletric.

12. A structure, as claimed in claim 10, wherein:
    said first dielectric is the same as said second dielectric and a portion of said connector is operatively attached to said dielectric.

13. A structure, as claimed in claim 10, wherein:

said first terminal of said resistor electrically contacts said second end of said connector and said second terminal of said resistor electrically contacts said said first upper plate of said first capacitor.

14. A structure, as claimed in claim 13, wherein said resistor is a chip resistor.

15. A structure, as claimed in claim 1, wherein:
said means for grounding includes a first substantially planar land for electrically contacting said first lower plate of said first capacitor and a second substantially planar land for electrically contacting said second lower plate of said second capacitor, a ground plane separated from said first and second lands by a substrate and a first ground pin connecting said first land to said ground plane and a second ground pin connecting said second land to said ground plane.

16. A structure, as claimed in claim 1, wherein:
said first dielectric is the same as said second dielectric.

17. A structure, as claimed in claim 1, wherein:
said means for grounding having a hole located intermediate said first lower plate of said first capacitor and said second lower plate of said second capacitor to reduce capacitive coupling between the field-effect transistor and said means for grounding.

18. A structure, as claimed in claim 1, wherein:
said first capacitor and said second capacitor are separated by at least the width of the housing at the point where the first and second source leads extend outward from the housing.

19. A structure, as claimed in claim 1, wherein:
said first upper plate of said first capacitor and said second upper plate of said second capacitor are positioned to contact said first source lead and said second source lead, respectively, outside of, and immediately adjacent to, a cylinder defined by a periphery of said housing.

20. A self-biased and source bypassed, packaged, field-effect transistor structure, comprising:
a packaged, field-effect transistor including a housing, a field-effect transistor located within said housing, and first and second source leads extending from said field-effect transistor, through said housing, and outward from said housing;
a grounding structure including a first substantially planar land, a second substantially planar land, a grounding plane spaced from said first and second land by a substrate, a first grounding pin electrically connecting said first land and said grounding plane, a second grounding pin electrically connecting said second land and said grounding plane, and a hole located intermediate said first and second lands, wherein at least a portion of said housing is located intermediate said field-effect transistor and said means for grounding;
a first capacitor for use in grounding the first source lead of the field-effect transistor during AC operation, said first capacitor having a first lower plate electrically contacting said first land and a first upper plate separated from said first lower plate by a first dielectric, said first dielectric having a first edge, said first upper plate and said first lower plate separated by a defined distance;
a second capacitor for use in grounding the second source lead of the field-effect transistor during AC operation, said second capacitor having a second lower plate electrically contacting said second land and a second upper plate separated from said second lower plate by said second dielectric, said second upper plate and said second lower plate separated by said defined distance;
a wrap-around connector including a first portion electrically contacting said first land, a second portion spaced from said first portion by said first dielectric and said defined distance, and a third portion extending along said first edge of said first dielectric and electrically connecting said first portion and said second portion, wherein said first upper plate of said first capacitor, said second upper plate of said second capacitor and said second portion of said wrap-around connector are substantially coplanar; and
a chip resistor having a first terminal electrically contacting said second portion of said wrap-around connector and a second terminal electrically contacting said first upper plate of said first capacitor.

21. A self-biased and source bypassed, packaged, field-effect transistor assembly for operation in the microwave range extending from approximately 1 GHz to 12 GHz, comprising:
a packaged, field-effect transistor including a housing, a field-effect transistor located inside said housing, and first and second source leads extending from said field-effect transistor, through said housing, and outward from said housing;
means for grounding, wherein at least a portion of said housing is located intermediate said field-effect transistor and said means for grounding;
a source resistor for use in biasing the field-effect transistor, said source resistor having a first terminal electrically contacting said means for grounding and a second terminal electrically contacting at least one of the source leads;
a first capacitor for use in grounding the first source lead of the field-effect transistor during AC operation, said first capacitor having a first lower plate electrically contacting said means for grounding and a first upper plate separated from said first lower plate by a first dielectric, wherein said first upper plate of said first capacitor is positioned immediately adjacent to the first source lead of the packaged, field-effect transistor for direct electrical connection therewith;
a second capacitor for use in grounding the second source lead of the field-effect transistor during AC operation, said second capacitor having a second lower plate electrically contacting said means for grounding and a second upper plate separated from said second lower plate by a second dielectric, wherein said second upper plate of said second capacitor is positioned immediately adjacent to the second source lead of the packaged, field-effect transistor for direct electrical connection therewith.

22. A self-biased and source bypassed packaged, field-effect transistor assembly, as claimed in claim 21, wherein:
said first source lead is in direct overlapping contact with said first upper plate of said first capacitor and said second source lead is in direct overlapping contact with said second upper plate of said second capacitor.

23. A self-biased and source bypassed packaged, field-effect transistor assembly, as claimed in claim 21, wherein:

said first upper plate of said first capacitor and said second upper plate of said second capacitor are substantially coplanar.

24. A self-biased and source bypassed packaged, field-effect transistor assembly, as claimed in claim 21, wherein:

said first source lead and said first upper plate are substantially parallel and said second source lead and said second upper plate are substantially parallel.

25. A self-biased and source bypassed packaged, field-effect transistor assembly, as claimed in claim 21, wherein:

said field-effect transistor is a gallium-arsenide, field-effect transistor.

* * * * *